United States Patent [19]
Cole et al.

[11] Patent Number: 5,527,741
[45] Date of Patent: Jun. 18, 1996

[54] FABRICATION AND STRUCTURES OF CIRCUIT MODULES WITH FLEXIBLE INTERCONNECT LAYERS

[75] Inventors: Herbert S. Cole, Burnt Hills; Raymond A. Fillion, Niskayuna; Bernard Gorowitz, Clifton Park, all of N.Y.; Ronald F. Kolc, Cherry Hill, N.J.; Robert J. Wojnarowski, Ballston Lake, N.Y.

[73] Assignee: Martin Marietta Corporation, Bethesda, Md.

[21] Appl. No.: 321,346

[22] Filed: Oct. 11, 1994

[51] Int. Cl.⁶ .................................................. H01L 21/60
[52] U.S. Cl. ..................... 437/209; 437/211; 437/214; 437/219; 437/220
[58] Field of Search ........................ 437/209, 211, 437/212, 213, 214, 215, 217, 218, 219, 220; 257/723, 724, 725, 773, 774, 772

[56] References Cited

U.S. PATENT DOCUMENTS

| | | |
|---|---|---|
| 4,783,695 | 11/1988 | Eichelberger et al. . |
| 4,835,704 | 5/1989 | Eichelberger et al. . |
| 4,894,115 | 1/1990 | Eichelberger et al. . |
| 4,933,042 | 6/1990 | Eichelberger et al. . |
| 5,055,907 | 10/1991 | Jacobs et al. . |
| 5,091,769 | 2/1992 | Eichelberger .......................... 257/723 |
| 5,111,278 | 5/1992 | Eichelberger .......................... 257/725 |
| 5,169,678 | 12/1992 | Cole et al. . |
| 5,223,084 | 6/1993 | Uesato et al. ........................ 156/651.1 |
| 5,353,195 | 10/1994 | Fillion et al. . |
| 5,353,498 | 10/1994 | Fillion et al. . |
| 5,452,182 | 9/1995 | Eichelberger et al. ................ 361/749 |

FOREIGN PATENT DOCUMENTS

| 17901 | 10/1992 | WIPO ................................... 257/685 |
|---|---|---|

OTHER PUBLICATIONS

"A New Multichip Interconnect Technology" by Scott L. Jacobs, et al, 1989 IEPS (International Electronics Packaging Society) Conference, Sep. 1989, pp. 283–293.

Primary Examiner—Tom Thomas
Assistant Examiner—Kevin M. Picardat
Attorney, Agent, or Firm—Geoffrey H. Krauss

[57] ABSTRACT

A method for fabricating a circuit module includes applying an outer insulative layer over a first patterned metallization layer on a first surface of a base insulative layer. A second surface of the base insulative layer has a second patterned metallization layer. At least one circuit chip having chip pads is attached to the second surface of the base insulative layer. Respective vias are formed to expose selected portions of the first patterned metallization layer, the second patterned metallization layer, and the chip pads. A patterned outer metallization layer is applied over the outer insulative layer to extend through selected ones of the vias to interconnect selected ones of the chip pads and selected portions of the first and second metallization layers.

13 Claims, 6 Drawing Sheets

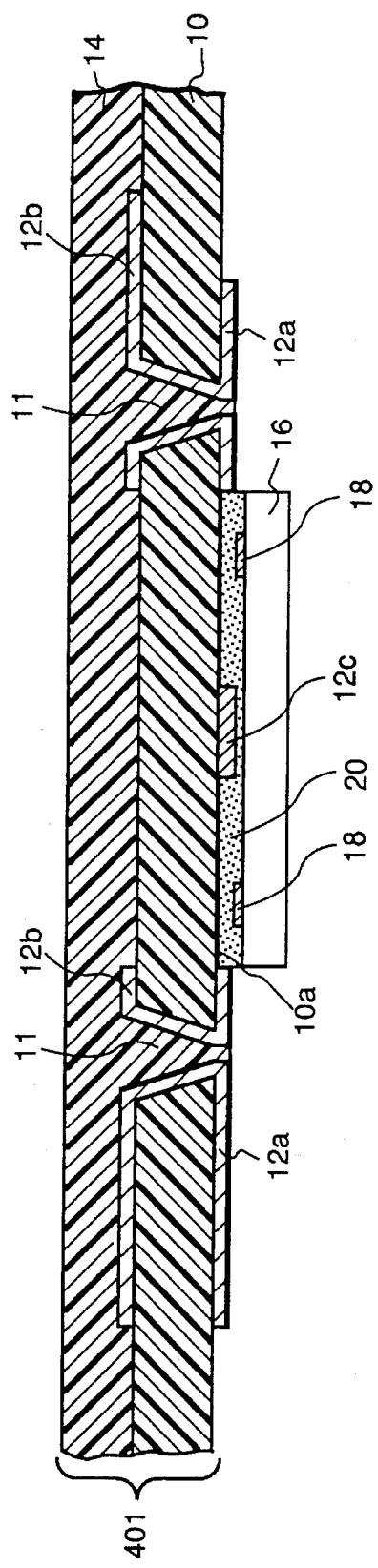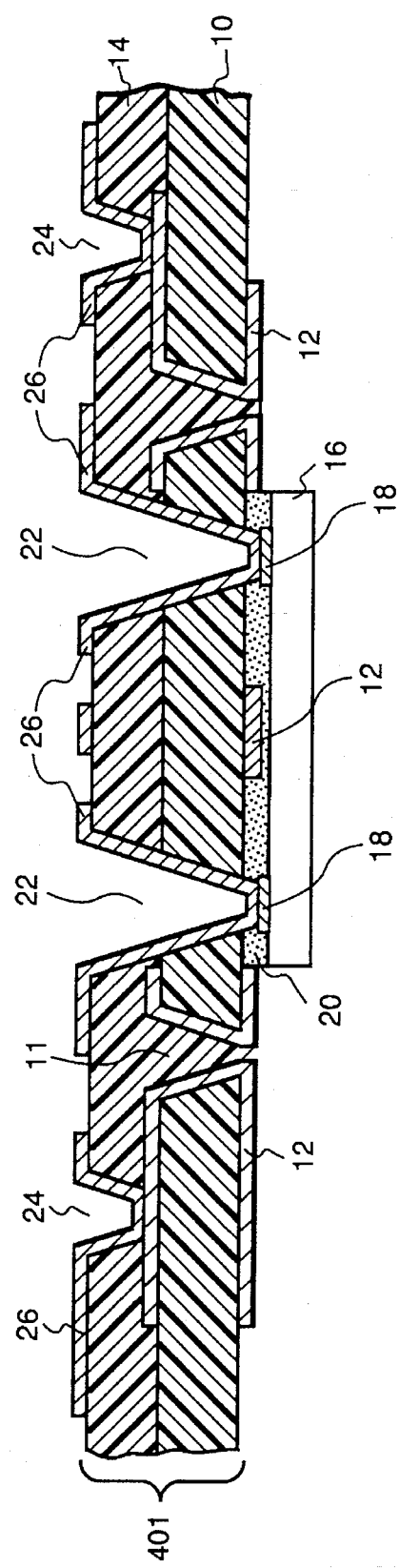

FABRICATION AND STRUCTURES OF CIRCUIT MODULES WITH FLEXIBLE INTERCONNECT LAYERS

BACKGROUND OF THE INVENTION

1. Field of the Invention

This invention relates generally to interconnection of integrated circuits and, more particularly, to fabrication of circuit modules using prefabricated flexible interconnect layers.

2. Description of the Related Art

In one form of high density interconnect, an adhesive-coated polymer film overlay covers a plurality of integrated circuit chips in chip wells on an underlying substrate. A preferred method of laser-drilling vias in the polymer film is described in Eichelberger et al., U.S. Pat. No. 4,894,115, issued Jan. 16, 1990. The polymer film provides an insulated layer upon which is deposited a metallization pattern for interconnection of individual circuit chips through the vias. Methods for performing a HDI process using overlays are further described in Eichelberger et al., U.S. Pat. No. 4,783,695, issued Nov. 8, 1988, and in Eichelberger et al., U.S. Pat. No. 4,933,042, issued Jun. 12, 1990. Multiple layers of polymer overlays and metallization patterns are typically applied, and significant processing steps are required to complete these multilayer interconnects.

Prefabricated flexible interconnect layers having metallization patterns thereon are manufactured by companies such as Sheldahl Corp., Northfield, Minn. and Parlex Corp., Methuen, Mass., for example. Multichip module and other electronic assembly manufacturers conventionally couple integrated circuit chips and other components to the metallization patterns using mechanical assembly attaching techniques such as wire bonding, tape automated bonding, or solder bumps. A prefabricated flexible interconnect structure typically has at least one insulative film layer having a thickness sufficient to support metallization patterns on each side. The thickness is often between 1 to 5 mils (25 to 125 microns).

Jacobs, U.S. Pat. 5,055,907, issued Oct. 8, 1991, describes a method of forming a thin film multilayer wiring decal on a support substrate and aligning and attaching one or more integrated chips to the decal to fabricate a semiconductor substrate. Reach-through vias connect the decal wiring to the chips. The total thickness of the thin film multilayer decal is described as being on the order of 15 microns for four layers. Laser drilling vias that have bottom openings of 1 mil by 1 mil, for example, through polymers having thicknesses greater than two or three mils (50 to 75 microns) is possible, but can be more difficult than laser drilling vias through the thin layers described in Jacobs.

SUMMARY OF THE INVENTION

An object of the present invention is to supply a method of manufacturing highly reliable multichip modules using a minimum number of manufacturing steps. The present invention provides for fabrication of circuit modules using prefabricated flexible interconnect layers and contacting techniques similar to those discussed in aforementioned Eichelberger et al., U.S. Pat. No. 4,783,695. Integrated circuit chips are bonded with an organic adhesive to a high density interconnect structure prefabricated on a flexible polymeric film having a metallization pattern on a surface facing the integrated circuit chips. The diameter of a via depends on the size of a chip pad. If a typical 1 mil diameter via is to extend through a flexible interconnect structure including an insulative film layer having a thickness on the order of 1 to 2 mils, the total number and thickness of layers must be minimized without sacrificing signal routing density.

Briefly, in accordance with a preferred embodiment of the invention, a method for fabricating a circuit module comprises providing a flexible interconnect structure including a base insulative layer having a first surface with a first patterned metallization layer and a second surface with a second patterned metallization layer and an outer insulative layer facing the first surface and the first patterned metallization layer. At least one circuit chip having chip pads is attached to the second surface. Respective vias are formed to expose selected portions of the first patterned metallization layer, the second patterned metallization layer, and the chip pads. A patterned outer metallization layer is applied over the outer insulative layer extending through selected ones of the vias to interconnect selected ones of the chip pads and selected portions of the first and second metallization layers.

In accordance with another preferred embodiment of the invention, a method for fabricating a circuit module comprises providing a flexible interconnect structure including a base insulative layer having a plurality of vias there through and an electrically conductive layer including a first patterned metallization layer portion on a first surface of the base insulation layer and a second patterned metallization layer portion on a second surface of the base insulative layer. A portion of the electrically conductive layer extends through these vias to couple the first and second metallization layer portions. An outer insulative layer is positioned to face the first surface and the first patterned metallization layer. A plurality of circuit chips having chip pads are attached to the second surface using an organic adhesive. Chip vias are formed through the outer insulative layer, the base insulative layer, and the organic adhesive to expose selected chip pads. Outer vias are formed through the outer insulative layer to expose selected portions of the first metallization layer. A patterned outer metallization layer extends through selected ones of the chip and outer vias to interconnect selected ones of the chip pads and selected portions of the first and second metallization layers.

Although the above embodiments have been described in terms of providing one flexible interconnect structure, additional flexible interconnect structures can be applied over a first flexible interconnect structure, if desired. Furthermore, a technique is described for achieving deep vias by fabricating a wide well and forming a smaller via through the bottom surface of the wide well.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

FIGS. 1–5 are sectional side views illustrating steps in a multilayer interconnection process.

DETAILED DESCRIPTION OF PREFERRED EMBODIMENTS OF THE INVENTION

Figure 1:
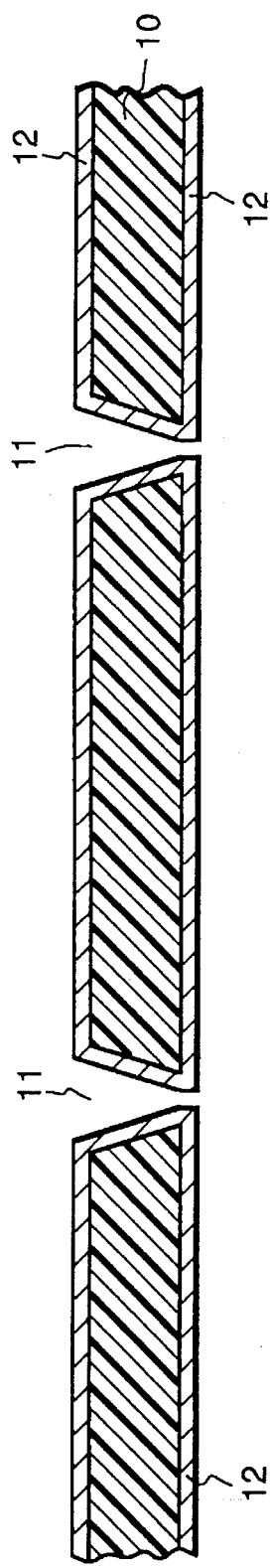

FIGS. 1–5 are sectional side views illustrating steps in a multilayer interconnection process of the present invention. FIG. 1 is a sectional side view of a base insulative layer 10 having base vias 11 and coated by a base metallization layer 12.

Base insulative layer 10 is an electrically insulating material and preferably comprises a polymer film upon which an electrically conductive material can adhere. Appropriate materials include, for example, Kapton H polyimide or Kapton E polyimide (Kapton is a trademark of E. I. du Pont de Nemours & Co.), Apical AV polyimide (Apical is a trademark of Kanegafugi Chemical Industry Company.), Upilex polyimide (Upilex is a trademark or UBE Industries, Ltd.), and Ultem polyetherimide (Ultem is a trademark of General Electric Co.).

Important properties for the base insulative layer include an elastic modulus and coefficients of thermal and humidity expansion which provide minimal dimensional change during processing. To maintain flexibility, the thickness of the base insulative layer is preferably minimized. At the same time, however, the base insulative layer must have enough rigidity (due to either thickness or material composition) to support layers of metallization on both surfaces and maintain dimensional stability through all subsequent processing steps. In one embodiment, a one mil thick polyimide layer is used.

The base insulative layer can have base vias 11 formed in predetermined locations. Preferably the vias are formed by laser drilling and the widest section of each via, at its bottom, is on the order of one mil. The base vias can alternatively be formed by methods such as mechanical drilling, punching, or reactive ion etching.

The base metallization layer is next deposited. In one embodiment, base metallization layer 12 comprises a thin seed metal layer coated by a thicker electroplated metal layer. A seed layer can be deposited on both surfaces of the base insulative layer and in the vias, for example, either by sputtering or by dipping the base insulative layer in a solution of $SnCl_2$ to catalyze the surface before immersing the base insulative layer in electroless nickel or copper plating solution. A thicker layer of copper can then easily be electroplated. Alternatively, the entire deposition process can be accomplished by sputtering. The preferred thickness of base metallization layer 12 ranges from two to ten micrometers, although thicker metals can also be applied.

Figure 2:
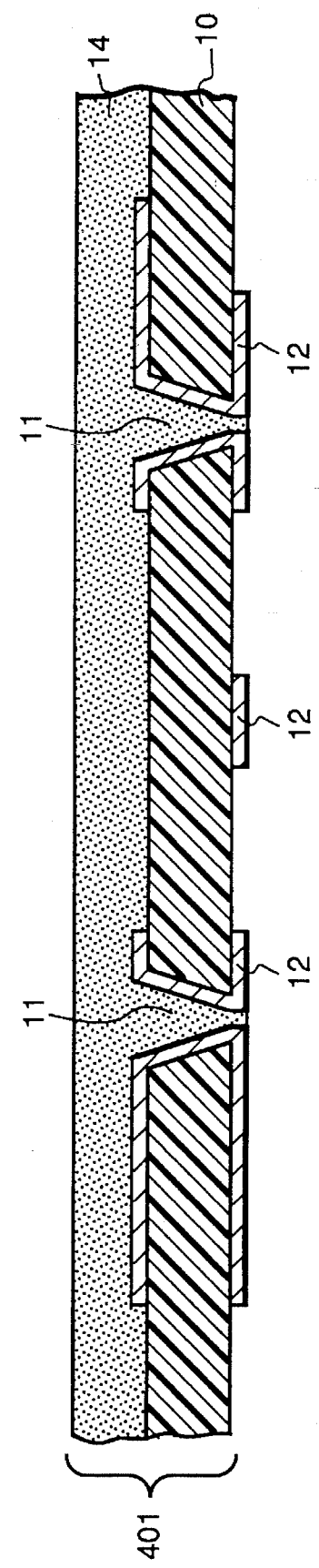

FIG. 2 is a view similar to that of FIG. 1, further showing base metallization layer 12 after patterning and the application of an outer insulative layer 14. The base metallization layer can be patterned using conventional photoresist patterns (not shown) through which copper can be etched with a ferric chloride solution, for example. The patterning can be quite dense. Electrical runs with widths of one mil can be separated by spaces with widths of one mil, for example.

Outer insulative layer 14 is applied so as to face a surface of the base insulative layer. There may be other insulative and metallization layers (not shown) between the base insulative layer and the outer insulative layer.

Outer insulative layer 14 is an insulating material which in one embodiment, for example, may comprise a material similar in composition to the material of base insulative layer 10, and can be applied using conventional coating techniques such as spin or spray coating from solution followed by bake steps to remove solvent and/or cure the insulative layer. The outer insulative layer can also be applied using conventional lamination techniques. Outer insulative layer 14 need not be the same thickness as the base insulative layer, but must provide sufficient dielectric isolation for subsequent interconnect metallization.

The base insulative layer, the base metallization layer, and the outer insulative layer of FIG. 2 form a flexible interconnect structure 401 which can be pre-manufactured and tested by a supplier in batch prior to shipment to an end user for interconnection with circuit chips.

FIG. 3 is a sectional side view of a circuit chip 16 attached to the base insulative layer of FIG. 2. For simplicity of illustration, the chip is shown as having chip pads 18 facing upward toward base insulative layer 10 held in place by chip adhesive 20. For ease of chip alignment, base insulative layer 10 can alternately be positioned with a chip-side surface 10a of the base insulative layer facing upward and chips can be placed face down on the chip-side surface.

Base insulative layer 10 can include the pre-patterned base metallization layer 12 anywhere except in the areas in close proximity to chip pads 18. Preferably, the metallization is patterned so that no chip pad would be closer than 1 mil to the base metallization layer. Chip-side portion 12a of the base metallization layer can include a metal run 12c between the circuit chip and the base insulative layer as long as the metal run does not interfere with access to selected chip pads. The circuit chips may comprise either integrated circuits or active or passive discrete circuit components. The circuit chips can be bound to the base and outer insulative layers with an organic adhesive 20 such as SPIE (siloxane-polyimide-epoxy) or a cyanoacrylate. Commercially available hot melt adhesives, die attach adhesives, and/or epoxies may also be used for chip bonding. An adhesive providing a void-free attachment to the flex circuit is desirable.

The adhesive preferably has sufficient optical absorption properties to allow subsequent laser via drilling to bond pads below. If an adhesive does not have sufficient optical absorption properties, a method for doping such adhesive to facilitate optical absorption can be used as described in Cole et al., U.S. Pat. No. 5,169,678.

The adhesive should bond well to the circuit chips and the base dielectric layer and have appropriate dielectric properties to isolate the chip pads and chip surface from mechanical or electrical contact with the base insulative and metallization layers. In one embodiment, a thin insulative layer of about 2 to 20 microns (not shown) is coated on the base insulative and base metallization layers prior to attaching the circuit chip to the base insulative layer, and the dielectric properties of the adhesive become less important.

The chip-side portion 12a of base metallization layer 12 on the surface of base insulative layer 10 which is facing the circuit chip is useful for reducing the number of required interconnection layers because it can be used for interconnect routing of electrical signals. Thus a higher amount of signal routing can occur on base insulative layer 10 than if only the outer side portion 12b of the base insulative layer were pattered. In some situations, the use of metallization on the chip-side portion of the base insulative layer can reduce the needed number of insulative layers.

FIG. 4 is a view similar to that of FIG. 3, further showing chip vias 22 through outer insulative layer 14, base insulative layer 10, and adhesive 20 to chip pads 18. Also shown are outer vias 24 through the outer insulative layer to base metallization layer 12, and an outer metallization layer 26 patterned on the outer insulative layer 14 and in vias 22 and 24. Although two insulative layers are shown in FIGS. 1–4, additional layers can be used if desired. For the fabrication of small diameter chip vias 24, the total thickness of the insulative layers should be as thin as feasible. In one embodiment an adaptive lithography system is used to provide the high density interconnections as described in Eichelberger et al., U.S. Pat. No. 4,835,704.

Outer metallization layer 26 comprises an electrically conductive material and can be applied using vacuum deposition, for example, by sequentially sputtering a thin layer of titanium, sputtering a thin layer of copper, and electroplating a thicker layer of copper (typically ranging from five to ten micrometers). The outer metallization layer can be patterned with photoresist to provide the desired connections between circuit chips and base metallization layers.

Fabrication of the outer metallization layer typically is preferably done under conditions where the structure is substantially planar in the region where the outer metallization layer is to be applied. If the circuit chips are of the same height, the surface of the outer insulative layer may be sufficiently planar without the use of a substrate or a support piece. If circuit chips are of different heights, either a substrate or a temporary support piece having surfaces with different depths can be used under the chips to provide a planar surface.

When the outer metallization layer is patterned, the chip-side portion of base metallization layer 12 must be protected so that no undesired further etching will occur. If a thin insulative layer coats the bottom surface of base metallization layer 12, the base metallization layer will be protected. Additionally, if the outer metallization layer is a different material than the base metallization layer and the base metallization layer does not react with the outer metallization etchant, isolation would not be required. Another alternative for protecting the base metallization layer is to use a temporary resist layer which is later removed.

A small frame of Kapton polyimide (not shown) can be used as a border surrounding the multichip array. The frame can include connector metallization for second level packaging or assembly (not shown). Additionally, in certain applications it is appropriate to apply a thin insulative polymer coating over an outer layer of metallization.

Figure 5:
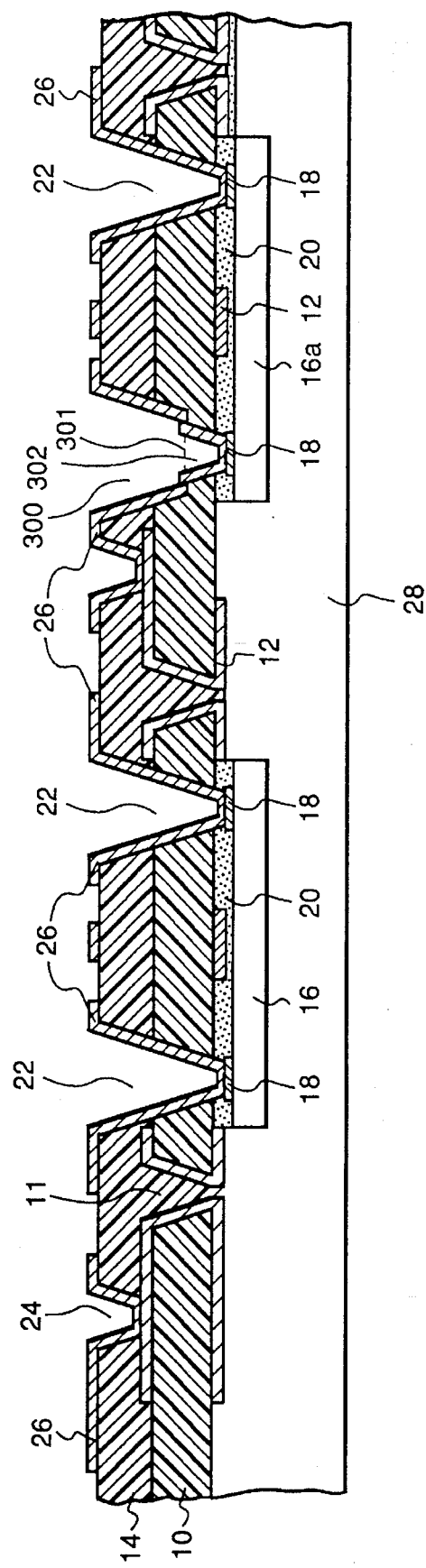

FIG. 5 is a sectional side view of a substrate 28 supporting the circuit chip and insulative layers of FIG. 4 as well as an additional circuit chip 16a. For simplicity, the embodiment has been illustrated in FIGS. 1–4 with a single circuit chip. Single circuit chips can be useful in some applications. Frequently multiple circuit chips will be used.

The structure can be used either with or without the addition of a substrate. If a substrate is applied, the circuit chips may be lowered into predetermined cavities or, preferably, a substrate is fabricated by positioning a mold form around the circuit chips and adding substrate molding material in a similar manner as described in Fillion et al., "Embedded Substrate For Integrated Circuit Modules," Ser. No. 08/087,434, filed Jul. 9, 1993, now U.S. Pat. No. 5,353,498 which is a continuation-in-part of application Ser. No. 08/014,481, filed Feb. 8, 1993, now U.S. Pat. No. 5,353,498 issued Oct. 11, 1994, which is herein incorporated by reference and describes a method of fabricating an HDI substrate by molding plastic around chips placed on a film. If no substrate is applied, the structure can be mounted to a board or other surface or stacked into a compact memory assembly, for example.

FIG. 5 further illustrates a multi-step deep via fabrication technique which can be used in any of the circuit module fabrication techniques of the present invention, as well as in other applications wherein deep vias are used. The first step is the formation of a wide well 300 having a bottom surface (shown by dashed line 301). The second step is the formation of a more conventional size via 302 at the bottom of the deep well. This stacked approach is useful because it provides for precision sized and shaped vias through thick layers of polymer material. The two steps can be performed by using two mask processes, by using an excimer laser and adjusting the beam size, or by using a programmable laser with the adaptive lithograph technique.

An approach which has been successfully demonstrated involves the use of an argon ion laser programmed to first ablate vias of the order of 3 mil cross-sections down to a predetermined depth above the chip pads, followed by the ablation of vias of 1 mil cross-sections at the bottom and extending to the chip pads.

Figure 6:
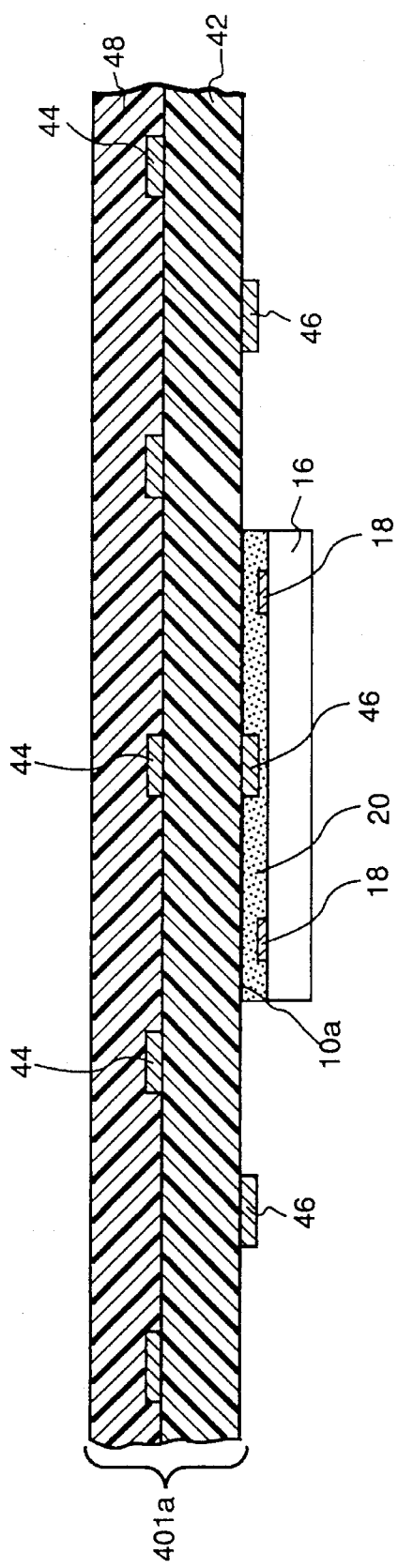
FIGS. 6 and 7 are sectional side views illustrating steps in another multilayer interconnection process.
Figure 7:
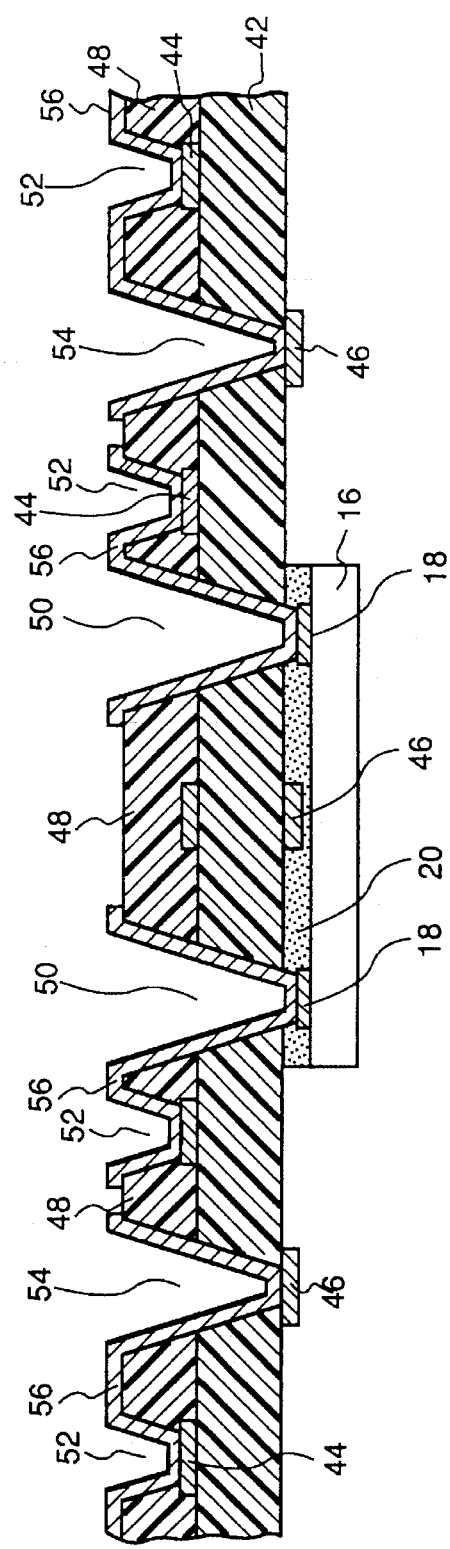

FIGS. 6 and 7 are sectional side views illustrating steps in another multilayer interconnection process. The fabrication steps are similar except for the absence in the flexible interconnect structure 401a of base vias 11 shown in FIGS. 1–5. FIG. 6 is a sectional side view of a base insulative layer 42 having a chip-side metallization layer 46 and an outer-side metallization layer 44. The outer-side metallization layer is overlaid with an outer insulative layer 48. A circuit chip 16 is attached to the base insulative layer as discussed with respect to FIG. 3.

FIG. 7 is a view similar to that of FIG. 6, further showing the interconnection of the circuit chip and the metallization layers. In this embodiment, three types of vias are used. Chip vias 50 extend through outer insulative layer 48, base insulative layer 42, and adhesive 20 to chip pads 18. Outer vias 52 extend through outer insulative layer 48 to outer-side metallization layer 44. Low vias 54 extend through outer insulative layer 48 and base insulative layer 42 to chip-side metallization layer 46. A layer of electrical conductors 56 is then applied and patterned to interconnect selected metallization layers and chip pads.

Figure 8:
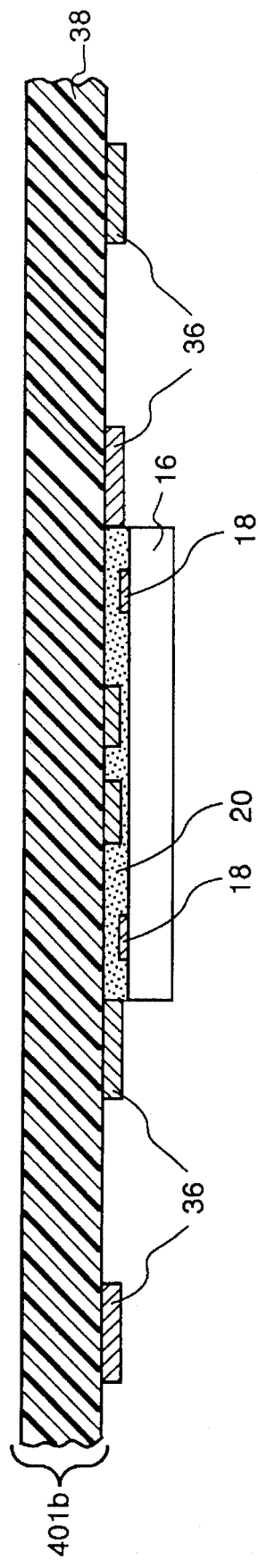
FIGS. 8 and 9 are sectional side views illustrating steps in a single layer interconnection process.
Figure 9:
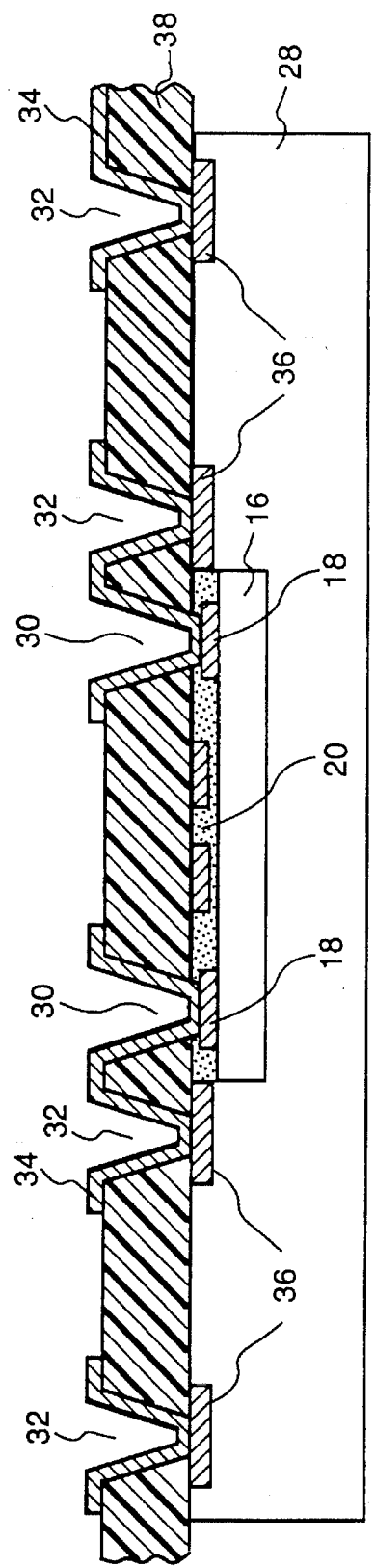

FIGS. 8 and 9 are sectional side views illustrating steps in a single layer flexible interconnect structure 401b fabrication process. The fabrication of a single layer structure is similar to that of the multiple layer structure. FIG. 8 is a sectional side view of a single insulative layer 38 having a patterned base metallization layer 36 on one surface without any through vias. The patterning of the base metallization layer is similar to that discussed in FIG. 2 except that only one surface is patterned. A circuit chip 16 is attached to the insulative layer. The circuit chip attachment process is the same as discussed with respect to FIG. 3.

FIG. 9 is a sectional side view of a substrate supporting the circuit chip and the insulative layer of FIG. 8. In this embodiment chip vias 30 extend through insulative layer 38 and adhesive 20 to chip pads 18, and base vias 32 extend through the insulative layer to base metallization layer 36.

Whether multiple insulative layers are used (as shown in FIGS. 1–7) or a single insulative layer is used (as shown in FIGS. 8–9), a significant advantage of the present invention is that the insulative and metallization layer or layers can be pre-fabricated and tested in bulk with only one laser via drilling and metallization sputtering step required to complete the interconnect structures.

Mass-produced prefabricated interconnect layers reduce the processing steps and thus the cost of chip interconnection. The layers can be fabricated on large panels and so that the only customizing that may be necessary is the final laser drilling of chip and outer vias and the patterning of the outer metallization layer.

Figure 10:
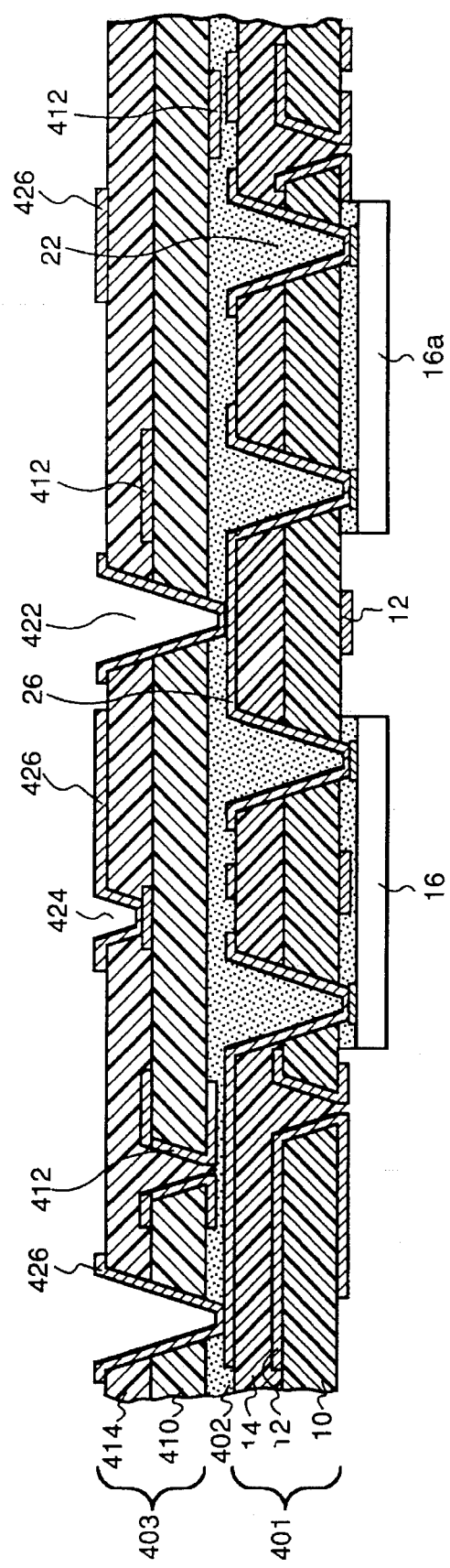
FIG. 10 is a sectional side view illustrating a circuit module including two flexible interconnect structures.

FIG. 10 is a sectional side view illustrating a circuit module including two flexible interconnect structures 401 and 403 which can contain as many as 6 levels of interconnect. Although FIG. 10 is shown as including two structures of the type shown in FIGS. 1–5, the process is equally applicable to the structures shown in FIGS. 6–7 and in FIGS. 8–9.

In this method, the circuit chips are coupled to the first flexible interconnect structure 401 and interconnected as discussed above. Next an additional flexible interconnect structure 403 including a second base insulative layer 410, a second base metallization layer 412, and a second outer insulative layer 414, is aligned to features on the first flexible interconnect structure and applied with adhesive 402 over the first flexible interconnect structure. In one embodiment, adhesive 402 extends at least partially, and preferably completely, into vias 22. Then vias 422 are formed to extend to the outer metallization layer of the first flexible interconnect structure and vias 424 are formed to the second base metallization layer, followed by the application of a second outer metallization layer 426. Because the flexible interconnect structures are applied in stages, the vias need be drilled through no more than 2 to 3 mils of polymer at any single time.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for fabricating a flexible circuit module, comprising the steps of:

providing a flexible base insulative layer having a first surface with a first patterned metallization layer and a second surface with a second patterned metallization layer and an outer insulative layer facing the first surface and the first patterned metallization layer;

attaching at least one circuit chip having chip pads to the second surface, the chip pads of the at least one circuit chip being isolated from the second patterned metallization layer;

forming respective vias through the base and outer insulative layers to portions of the first patterned metallization layer, the second patterned metallization layer, and the chip pads; and providing a patterned outer metallization layer over the outer insulative layer extending through selected ones of the vias to interconnect selected ones of the chip pads and selected portions of the first and second metallization layers.

2. The method of claim 1, wherein the step of providing a base insulative layer having a first surface with a first patterned metallization layer and a second surface with a second patterned metallization layer comprises:

applying an electrically conductive coating on an insulative film; and selectively removing portions of the electrically conductive coating from the insulative film to form patterns of electrically conductive material on the first and second surfaces.

3. The method of claim 1, wherein the step of forming respective vias includes forming a chip via to a respective chip pad by first forming a well in the insulative layers having a bottom surface situated above the respective chip pad, and then forming the chip via in the well.

4. The method of claim 1, further including the steps of:

providing, over the outer metallization layer, an additional base insulative layer having an additional first surface with an additional first patterned metallization layer and an additional second surface with an additional second patterned metallization layer attached to the outer insulative layer and an additional outer insulative layer facing the additional first surface and the additional first patterned metallization layer; and forming respective additional vias through the additional base and outer insulative layers to portions of the additional first patterned metallization layer, the additional second patterned metallization layer, and the outer metallization layer; and providing an additional patterned outer metallization layer over the additional outer insulative layer extending through selected ones of the additional vias to interconnect selected portions of the outer metallization layer and the additional first and second metallization layers.

5. The method of claim 1, further including the step of:

providing, over the outer metallization layer, an additional base insulative layer having an additional first surface and an additional second surface with an additional second patterned metallization layer attached to the outer insulative layer;

forming respective additional vias through the additional base and outer insulative layers to portions of the additional second patterned metallization layer and the outer metallization layer; and providing an additional patterned outer metallization layer over the additional outer insulative layer extending through selected ones of the additional vias to interconnect selected portions of the outer metallization layer and the additional second metallization layer.

6. The method of claim 1, wherein, prior to applying the outer insulative layer, the base insulative layer has formed therein base vias extending through the first surface to the second surface and wherein the first and second metallization layers are coupled through at least one of the base vias.

7. A method for fabricating a flexible circuit module, comprising the steps of:

providing a flexible base insulative layer having a contact surface with a base metallization layer;

attaching at least one circuit chip having chip pads to the contact surface of the base insulative layer, the chip pads of the at least one circuit chip being isolated from the base metallization layer;

forming vias through the base insulative layer extending to a selected chip pad and a selected portion of the base patterned metallization layer; and providing a patterned outer metallization layer over the base insulative layer extending through the vias to interconnect the selected chip pad and the selected portion of the base metallization layer.

8. A method for fabricating a flexible circuit module, comprising the steps of:

providing a flexible base insulative layer having a plurality of vias there through;

providing an electrically conductive layer including a first patterned metallization layer on a first surface of the base insulation layer and a second patterned metallization layer on a second surface of the base insulative layer, the electrically conductive layer extending through at least one of the vias to couple the first and second metallization layers;

applying an outer insulative layer over the first surface and the first patterned metallization layer;

attaching a plurality of circuit chips having chip pads to the second surface using an organic adhesive;

forming chip vias through the outer insulative layer, the base insulative layer, and the organic adhesive to expose selected chip pads;

forming outer vias through the outer insulative layer to expose selected portions of the first metallization layer;

providing a patterned outer metallization layer extending through selected ones of the chip vias and outer vias to interconnect selected ones of the chip pads and selected portions of the first and second metallization layers.

9. The method of claim 8, wherein the step of providing an electrically conductive layer comprises applying an electrically conductive coating on an insulative film by dipping the insulative film in a solution to catalyze the surface, immersing the insulative film in an electroless metal plating solution, and electroplating the electroless metal.

10. A method for forming a deep via through at least one layer of insulative material, comprising the steps of: forming in and only partly through the total thickness of the at least one layer a relatively-wide well having a bottom surface; and forming in the bottom surface of the well a via smaller than the relatively-wide well bottom surface and extending through a remainder of the thickness of the at least one layer.

11. The method of claim 10, wherein the well bottom surface is about three times the size of the via.

12. A method for fabricating a flexible circuit module, comprising the steps of:

providing a flexible base insulative layer having a first surface with a first patterned metallization layer and a second surface with a second patterned metallization layer attaching at least one circuit chip having chip pads to the second surface, the chip pads of the at least one circuit chip being isolated from the second patterned metallization layer;

applying an outer insulative layer facing the first surface and the first patterned metallization layer;

forming respective vias through the base and outer insulative layers to portions of the first patterned metallization layer, the second patterned metallization layer, and the chip pads; and providing a patterned outer metallization layer over the outer insulative layer extending through selected ones of the vias to interconnect selected ones of the chip pads and selected portions of the first and second metallization layers.

13. The method of claim 12, wherein, prior to attaching the at least one circuit chip, the base insulative layer has formed therein base vias extending through the first surface to the second surface and wherein the first and second metallization layers are coupled through at least one of the base vias.

* * * * *